(12) United States Patent
Rodgers et al.

(10) Patent No.: US 7,720,451 B2
(45) Date of Patent: May 18, 2010

(54) METHODS AND APPARATUS FOR CALIBRATING OSCILLATORS IN A RECEIVER

(75) Inventors: William Ellis Rodgers, Fort Wayne, IN (US); Richard Alan Kwolek, Fort Wayne, IN (US); Bruce Wight, Fort Wayne, IN (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 919 days.

(21) Appl. No.: 11/002,151

(22) Filed: Dec. 3, 2004

(65) Prior Publication Data

US 2006/0121864 A1   Jun. 8, 2006

(51) Int. Cl.
*H04B 1/18* (2006.01)
(52) U.S. Cl. .................... 455/182.1; 455/209; 455/260; 455/265
(58) Field of Classification Search ............... 455/182.1
See application file for complete search history.

(56) References Cited

U.S. PATENT DOCUMENTS

| | | | |
|---|---|---|---|
| 3,829,769 A | 8/1974 | Ashida | |
| 4,001,714 A | 1/1977 | Reed | |
| 4,453,136 A | 6/1984 | Kelland | |
| 4,498,059 A | 2/1985 | Edwards et al. | |
| 4,696,056 A * | 9/1987 | Morita | 455/182.1 |
| 5,023,572 A | 6/1991 | Caldwell et al. | |
| 5,361,407 A * | 11/1994 | Sawada et al. | 455/209 |
| 5,483,201 A | 1/1996 | Bortolini | |
| 5,493,710 A | 2/1996 | Takahara et al. | |
| 5,629,649 A | 5/1997 | Ujiie | |

(Continued)

FOREIGN PATENT DOCUMENTS

EP   595013   5/1994

(Continued)

OTHER PUBLICATIONS

Hastings, M.V., "Easi-build" 100 kHz calibrator, *Radio & Electronics Constructor*, vol. 32, No. 4, pp. 208-211, Dec. 1978 (Abstract).

(Continued)

*Primary Examiner*—Yuwen Pan
*Assistant Examiner*—Ajibola Akinyemi
(74) *Attorney, Agent, or Firm*—Edell, Shapiro & Finnan, LLC (57) ABSTRACT

A receiver includes a first oscillator supplying a reference frequency signal; a reference signal generator producing a first frequency conversion signal and a local calibration signal from the reference frequency signal; a first frequency converter responsive to the first frequency conversion signal to down-convert the received signal during normal receive operation and to down-convert the local calibration signal during calibration processing; a second frequency converter responsive to a second frequency conversion signal from a second oscillator to further down-convert the received signal and the local calibration signal; a demodulator that demodulates the received signal at a demodulation frequency; and a frequency error processor that determines a frequency error from the local calibration signal at the demodulation frequency, wherein the reference signal generator adjusts a frequency of the first frequency conversion signal used during normal receive operation in response to the frequency error to compensate for the frequency error.

27 Claims, 4 Drawing Sheets

U.S. PATENT DOCUMENTS

| | | | |
|---|---|---|---|
| 5,892,408 A | | 4/1999 | Binder |
| 6,154,640 A | | 11/2000 | Itoh et al. |
| 6,157,198 A | | 12/2000 | Mauerman |
| 6,449,217 B1 | | 9/2002 | Hayet et al. |
| 6,657,678 B1 | * | 12/2003 | Mizukami et al. ........... 348/726 |
| 6,757,340 B1 | * | 6/2004 | Jakobsson ................... 375/319 |
| 6,909,470 B2 | * | 6/2005 | Mizukami et al. ........... 348/726 |
| 2002/0123316 A1 | | 9/2002 | Sih et al. |
| 2003/0095008 A1 | | 5/2003 | Kranz |
| 2006/0064260 A1 | * | 3/2006 | Stein et al. .................... 702/76 |

FOREIGN PATENT DOCUMENTS

| | | |
|---|---|---|
| JP | 62-298098 | 12/1987 |
| JP | 63-236417 | 10/1988 |
| JP | 11-16467 | 1/1990 |
| JP | 11-183661 | 7/1990 |

OTHER PUBLICATIONS

Burhans, R.W., "Frequency calibration using WWV (radio station)," *Radio-Electronics*, vol. 54, No. 9, pp. 62-63, Sep. 1983 (Abstract).

Siuber, W., "Calibration of high frequency oscillators," *Elektronik*, vol. 39, No. 2, pp. 78-80, Jan. 19, 1990 (Abstract).

Siu et al., "The feasibility study of GPS common-view based frequency standards using fuzzy logic controller," *IMTC/98 Conference Proceedings*, vol. 2, pp. 820-824, 1998.

Deno et al., "A low cost high stability microcontroller compensated crystal oscillator," Proceedings of the 1998 IEEE International Frequency Control Symposium, pp. 353-360, 1998.

* cited by examiner

METHODS AND APPARATUS FOR CALIBRATING OSCILLATORS IN A RECEIVER

FIELD OF THE INVENTION

This application relates to oscillator calibration, and more particularly, to methods and apparatus for calibrating one or more low accuracy oscillators using a high accuracy oscillator in RF receivers and the like.

BACKGROUND

Heterodyne types of radio receivers use multiple oscillator frequencies to convert incoming RF signals from the RF carrier frequency to a lower frequency at which demodulation is performed. In this process, the signal may be down-converted from RF to one or more intermediate frequencies (IFs) before being demodulated. The demodulation can be performed at an IF frequency (e.g., 455 kHz, 10.7 MHz, etc.) or at a baseband frequency using the I-Q complex representation of the signal. The overall receiver stability is a function of the sum of the stabilities of all oscillators used in the frequency conversions.

Ideally, the conversion frequencies should be synthesized from a single, high-accuracy oscillator. However, this is not always the most cost-effective approach where low receiver cost is a requirement. Even where a high-accuracy oscillator is used for down-converting from RF to IF, system requirements or design considerations may dictate the use of certain frequencies for subsequent down-conversion stages that cannot be derived from the high-accuracy oscillator. For example, the frequencies of intermodulation products resulting from down conversion may rule out use of certain frequencies or combinations of frequencies in the down conversion scheme. Another factor in selecting conversion frequencies is the availability of off-the-shelf components at certain frequencies. Where the down-conversion frequencies cannot all be derived from a single oscillator, cost considerations may prohibit the use of additional high accuracy oscillators at these other frequencies. Consequently, many lower-cost designs use one or more inexpensive crystal oscillators for the lower oscillator frequencies, where the frequency error introduced by the oscillator will be less. Because manufacturers specify the stability of crystal oscillators in parts-per-million (or ppm), lower crystal frequencies introduce less total frequency error.

One drawback of current designs that employ lower-cost oscillators is that these oscillators degrade receiver performance. A typical tradeoff is to increase receiver bandwidth to accommodate frequency errors introduced by the lower accuracy oscillators. A wider bandwidth helps to ensure that down-converted signals remain within the receiver bandwidth despite being offset from the center of the band as a consequence of oscillator-induced frequency errors. However, increased bandwidth decreases receiver performance with weak signals and rejection of adjacent channel interference. In some cases, if the frequency error is too large, the receiver phase demodulators may not even work. Accordingly, there remains a need for receiver designs and techniques that minimizing frequency errors introduced by low accuracy oscillators in RF receivers such as radio receivers.

SUMMARY OF THE INVENTION

According to a first aspect of the invention, a receiver includes a reference signal generator having a first oscillator, a first frequency converter such as a mixer, a second frequency converter and oscillator, a demodulator, and a frequency error processor. The reference signal generator produces a first frequency conversion signal and a local calibration signal from a reference frequency signal supplied by the first oscillator. Using the first frequency conversion signal, the first frequency converter down-converts received signals during normal receive operation and down-converts the local calibration signal during calibration processing. The local calibration signal can be a harmonic of the reference frequency signal. A harmonic filter can be used to filter out the reference frequency signal and all but the harmonic to be used as the local calibration signal.

Using a second frequency conversion signal from the second oscillator, the second frequency converter further down-converts received signals during normal receive operation and further down-converts the local calibration signal during calibration processing. The second oscillator has a lower accuracy than the first oscillator; consequently, the second down-conversion introduces significant frequency error into down-converted signals.

During normal receive operation, the demodulator demodulates received signals at a demodulation frequency (e.g., a baseband or intermediate frequency). During calibration processing, the frequency error processor receives the local calibration signal at the demodulation frequency and determines the frequency error from the local calibration signal. The harmonic used as the calibration signal may be on a receive frequency not used for normal communications. In general, this is desired, because any harmonic leak-through would otherwise interfere with the received signal during normal operation. Based on the measured frequency error, the reference signal generator adjusts the first frequency conversion signal used during normal receive operation to compensate for the frequency error. Specifically, the reference signal generator can include a frequency synthesizer that generates the first frequency conversion signal used during normal receive operation based on the reference frequency signal and a signal from the frequency error processor indicative of the frequency error.

During calibration processing, the receiver is isolated from external signals by disconnecting the antenna from the receiver and, optionally, by de-tuning the RF amplifier to a frequency different from the local calibration signal. Essentially, a set of switches can be used to supply either signals from the antenna (during normal receive operation) or the local calibration signal (during calibration processing) to the receiver.

During calibration processing, the reference signal generator adjusts the first frequency conversion signal such that the frequency of the down-converted local calibration signal is centered in the IF passband. In this manner, any measured frequency error can be attributed to the second oscillator. According to one option, the frequency error processor can determine the frequency error from the inphase (I) and quadrature (Q) samples of the local calibration signal, wherein the magnitude of the frequency error is determined from the rate of phase rotation computed from the arctangent of (Q/I), and the sign of the frequency error is determined from the direction of phase rotation. In this manner, the frequency error can be measured to an accuracy of a partial cycle at the demodulation frequency. According to another option, the frequency error can be determined from a control signal generated by a phase lock loop (PLL) type demodulator. In this case, the voltage that controls the voltage controlled oscillator (VCO) in the PLL has a nominal value that sets the frequency of the VCO. The measured error is a function of the difference between the actual voltage at calibration and the nominal voltage.

The receiver can include a plurality of down-conversion stages and a plurality of lower accuracy oscillators that supply the frequency conversion signals to the respective mixers of these stages. In this case, the measured frequency error is a composite frequency error resulting from frequency errors caused by the plurality of lower accuracy oscillators, and the reference signal generator adjusts the frequency of the first frequency conversion signal used during normal receive operation to compensate for the composite frequency error.

In accordance with another aspect of the invention, in a receiver employing a reference oscillator and a lower accuracy oscillator, a method for calibrating oscillator frequency to compensate for a frequency error caused by the lower accuracy oscillator includes isolating the receiver from external signals; generating a local calibration signal from a reference frequency signal supplied by the reference oscillator; down-converting the frequency of the local calibration signal in accordance with a first frequency conversion signal generated from the reference frequency signal; further down-converting the frequency of the local calibration signal in accordance with a second frequency conversion signal generated by the lower accuracy oscillator; measuring the frequency error from the local calibration signal at a demodulation frequency; and adjusting a frequency of the first frequency conversion signal used for subsequent reception of external signals to compensate for the frequency error.

The above and still further objects, features and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

DETAILED DESCRIPTION

According to the invention, a harmonic of a signal generated by a high accuracy oscillator of a receiver can be used as a local calibration signal to correct for frequency errors caused by a lower accuracy oscillator operating in the receiver. The receiver can be calibrated to this known-frequency signal by measuring the frequency error present at the demodulator. With an I-Q type demodulator, the measured frequency error can be calculated by measuring the phase rotation versus time. This measured error can then be used to correct the tune frequency for all receiver channels. As described herein in greater detail, the techniques of the present invention can also be applied in other types of demodulators and the frequency error can be measured in different manners.

Figure 1:
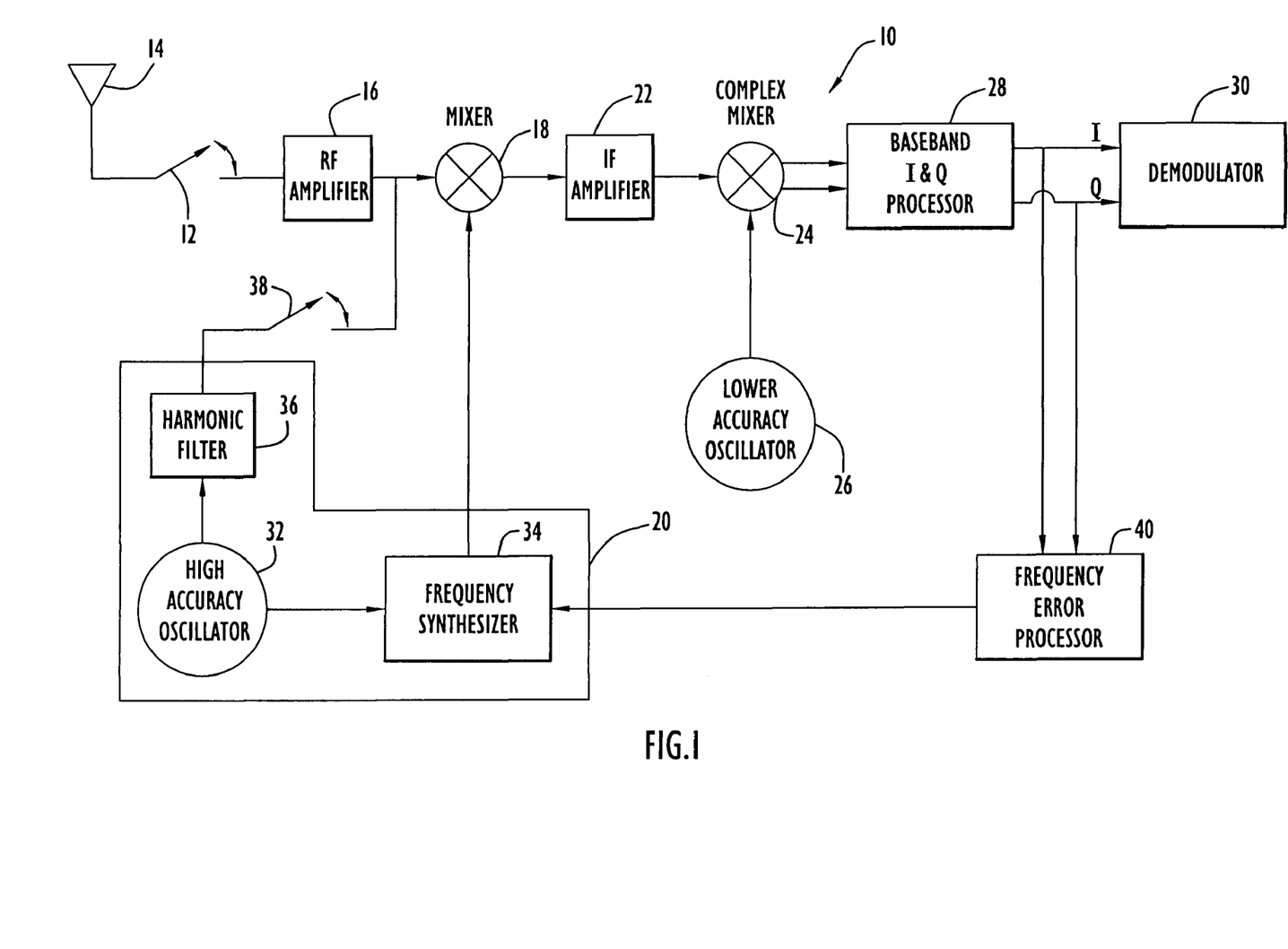
FIG. 1 is a functional block diagram of relevant components of an RF receiver having a single intermediate frequency (IF) and illustrating the concept of using a harmonic of a high accuracy oscillator as a local input calibration signal to calibrate a lower accuracy oscillator.

Referring to FIG. 1, a heterodyne receiver 10 having a single intermediate frequency (IF) is used to illustrate the concept of the invention. It will be understood, however, that the invention is not limited to receivers with a single IF stage and is equally applicable to receivers with multiple IF stages. Further, the invention is not limited to receivers in which demodulation occurs at baseband and is equally applicable in system employing IF demodulation. During normal receive operation, a switch 12 in the path between an antenna 14 and an RF amplifier 16 is closed, permitting incoming RF signals intercepted by antenna 14 to be received by RF amplifier 16. As used herein, the terms "switch" refers to virtually any mechanism that selectively passes or blocks a signal traveling along a path, including any of a variety of mechanical and electronic devices suitable for use in a receiver. The amplified RF signal produced by RF amplifier 16 is supplied to a first frequency converter 18 (e.g., a first mixer), which down-converts the RF carrier frequency to an IF frequency using a first frequency conversion signal supplied by a reference signal generator 20. The IF signal generated by first mixer 18 is essentially a difference signal between the incoming RF signal and the first frequency conversion signal. After amplification by an IF amplifier 22, the resulting IF signal is supplied to a second frequency converter 24 (e.g., a second mixer) which down-converts the IF signal to baseband using a second frequency conversion signal supplied by a lower accuracy oscillator 26. In this example, second mixer 24 performs complex mixing to generate inphase (I) and quadrature (Q) signals which are processed by baseband I & Q processor 28 to produce I and Q baseband output signals. Baseband I & Q processor 28 can include, for example, two low pass filters for the respective I and Q signals and, optionally, analog-to-digital (A/D) converters. The I and Q outputs can be used for demodulating most types of modulation and, under normal receive operation, are processed by a demodulator 30 to recover the information contained in the received signal.

Reference signal generator 20 includes a high accuracy reference oscillator 32 and a frequency synthesizer 34 that receives a reference frequency signal from high accuracy reference oscillator 32 and generates the first frequency conversion signal that is supplied to first mixer 18. Frequency synthesizer 34 is essentially capable of making frequency adjustments to the reference frequency signal using, for example, a software-controlled process. Reference oscillator 32 also supplies the reference frequency signal, including all of its harmonics, to a harmonic filter 36 that passes a selected harmonic of the reference frequency signal to first mixer 18 via a path containing a switch 38, while filtering out the reference frequency signal and the other harmonics. This harmonic of the reference frequency signal serves as a local calibration signal during calibration processing. During normal receive operation, switch 38 remains open such that the harmonic signal is not supplied to first mixer 18. It should be understood that inclusion of the reference oscillator, frequency synthesizer, and harmonic filter within a "reference signal generator" is merely a conceptual representation for explaining the invention, and the invention does not require particular operations to be performed or signals to be generated by any specific architecture or hardware configuration. The principal point of the reference signal generator representation is that both the first frequency conversion signal and the local calibration signal are derived in some manner from the reference frequency signal supplied by the high accuracy reference oscillator. In practice, the operations performed and hardware/software used to generate the first frequency conversion signal from the reference frequency signal can be integrated with or separate from those associated with generating the local calibration signal from the reference frequency signal.

High accuracy reference oscillator 32 is preferably a very stable oscillator, such as a temperature controlled crystal oscillator (TCXO) having an accuracy on the order of 2 parts per million (ppm) or better. More generally, however, the high accuracy reference oscillator can have any accuracy that is sufficient to ensure acceptable receiver performance, and as used herein terms such as "high accuracy oscillator," "higher accuracy oscillator," "high accuracy reference oscillator," and "reference oscillator" refer to an oscillator having an accuracy greater than a lower accuracy oscillator of the receiver. By way of a non-limiting example, the lower accuracy oscillator 26 can have an accuracy on the order of 50 ppm. However, the lower accuracy oscillator is not limited to any particular accuracy, and as used herein, the terms "low accuracy oscillator" and "lower accuracy oscillator" refer to an oscillator having an accuracy less than the reference (high or higher) accuracy oscillator of the receiver. Typically, the reference oscillator is more accurate than the lower accuracy oscillator by about an order of magnitude or more.

Oscillator error can be characterized as having a component due to a fixed offset relative to a nominal frequency value and a drift component that varies over time, principally due to changes in temperature. By way of a non-limiting example, an oscillator having an accuracy of 50 ppm may specify an accuracy of 20 ppm for the fixed frequency error and an accuracy of 30 ppm attributable to temperature drift. The drift component of the frequency error generally requires that calibration be performed repeatedly during operation of the receiver. At typical IF frequencies, such inaccuracies would result in frequency errors on the order of a few kilohertz (e.g., 2 kHz or so) which would typically be well within the IF bandwidth.

Figure 2:
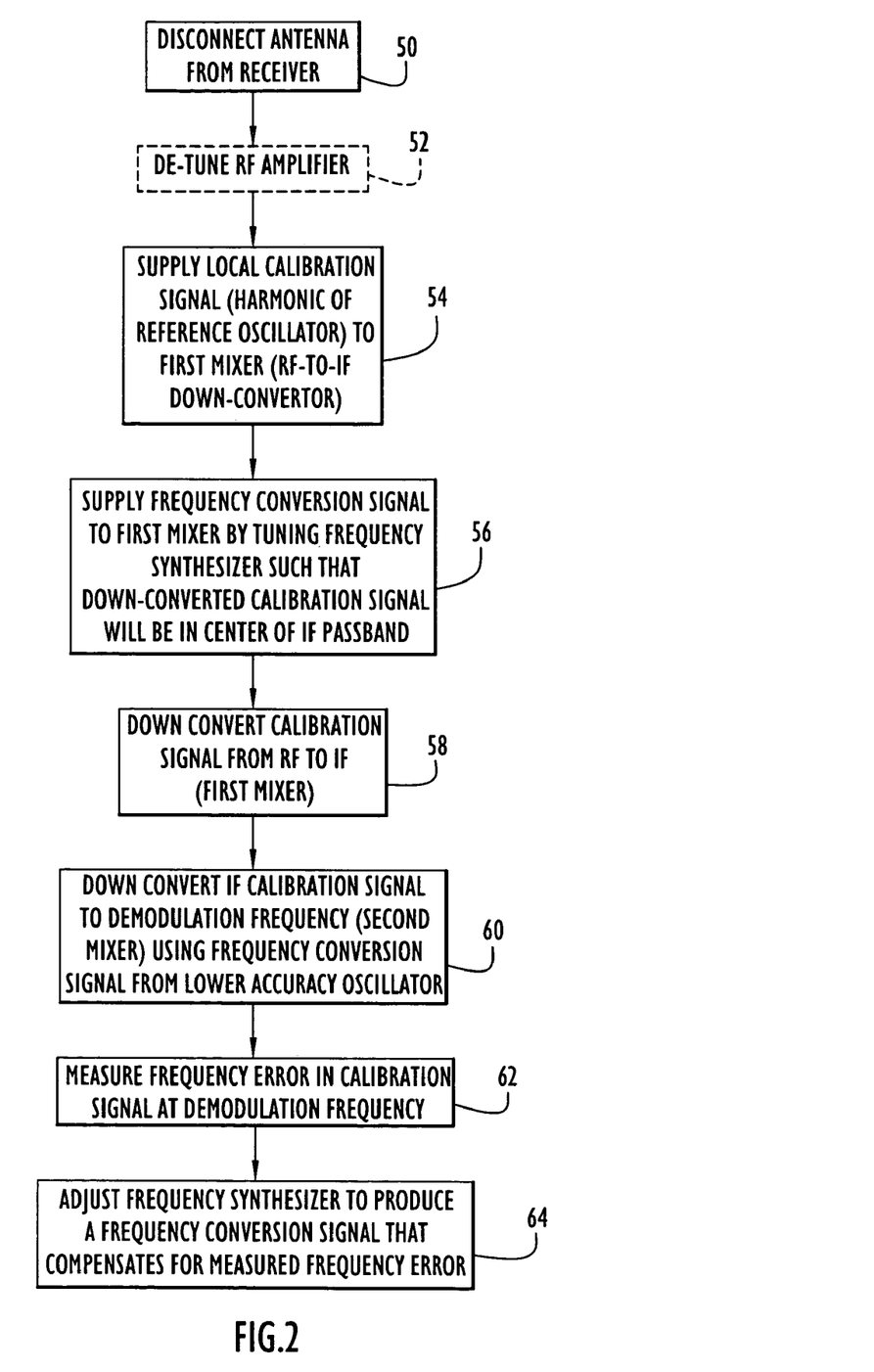
FIG. 2 is a flow chart illustrating operations performed to calibrate the receiver of FIG. 1 to compensate for frequency errors caused by a lower accuracy oscillator.

The flow chart of FIG. 2 illustrates the operations performed in the calibration process carried out in the exemplary receiver shown in FIG. 1. When calibration is to be performed, switch 12 is opened (operation 50), thereby preventing external signals at antenna 14 from reaching RF amplifier 16 and first mixer 18 and interfering with the calibration process. In operation 54, switch 38 is closed such that the harmonic selected by harmonic filter 36 is supplied to first mixer 18 to introduce a known, locally-generated, unmodulated calibration signal into the receive path (i.e., this calibration signal reflects the accuracy of the reference oscillator).

Referring again to FIG. 1, note that the local calibration signal (i.e., the harmonic of the reference frequency signal) is supplied to first mixer 18 via a connection that is downstream of RF amplifier 16, and does not pass through RF amplifier 16. As shown in FIG. 1, the calibration signal essentially can be supplied directly to first mixer 18. Introducing the local calibration signal into the receiver signal path downstream of the RF amplifier is preferable to introducing the calibration signal upstream of the RF amplifier (e.g., as would be the case with a remotely-generated or external calibration signal), because substantially better isolation from external signal can be achieved, resulting is significantly less interference with the calibration signal.

Specifically, even with antenna 14 disconnected from RF amplifier 16 (switch 12 open), the isolation between the antenna and the RF amplifier may not be sufficient to avoid an unwanted level of interference during calibration (e.g., isolation may be on the order of 30 dB). To achieve better isolation during calibration, in operation 52 shown in FIG. 2, the RF amplifier can be electronically de-tuned to a frequency that is significantly different from the frequency of the harmonic signal used as the calibration signal, such that any signals passed downstream by RF amplifier 16 do not interfere with the calibration signal. For example, with a 12.8 MHz reference oscillator, the third harmonic at 38.4 MHz can be used as the calibration signal, since this frequency may be near the operating RF frequency of the receiver used during normal receive operation and therefore compatible with the down-conversion frequencies that can be generated by the frequency synthesizer to produce a signal in the center of the IF passband. To avoid interference and achieve better isolation, the filters in the RF amplifier (e.g., passband filters) can be de-tuned during calibration to a frequency of 30.0 MHz, which results in very little interference with the 38.4 MHz calibration signal (e.g., isolation may be on the order of 100 dB or more). The additional isolation achieved by de-tuning the RF amplifier is possible only if the calibration signal is generated locally and is introduced downstream of the RF amplifier, such that the calibration signal does not pass through the RF amplifier.

During calibration, frequency synthesizer 34 is tuned to generate a frequency conversion signal (operation 56) that will produce an IF difference signal in the center of the IF passband when mixed with the calibration signal from harmonic filter 36 (operation 58). In other words, the tune frequency of first mixer 18 is adjusted so that first mixer 18 down converts the harmonic signal to the center of the IF passband. Typically, the frequency of the reference frequency signal generated by the reference oscillator is chosen such that harmonics of the reference frequency do not fall in the receiver channel, because the harmonics cause interference. Consequently, by design, the harmonics of the reference frequency signal, including the harmonic used for calibration, typically would not be directly in the receiver channel. Thus, re-tuning of frequency synthesizer 34 may be required during calibration to produce the desired IF signal when mixed with the calibration signal (i.e., the frequency conversion signal used during calibration will not, in general, be at the same frequency as the frequency conversion signal used to down-convert incoming RF signals during normal receive operation). However, the frequency of the harmonic signal is preferably selected to be near the normal RF operating frequency of the receiver so that any required re-tuning of frequency synthesizer during calibration is within the operating range of the frequency synthesizer.

As previously explained, the frequency to which the filters of the RF amplifier are de-tuned should be selected to be offset from the frequency of the calibration signal. The extent to which de-tuning of the RF amplifier improves isolation depends on the difference in frequency between the harmonic signal and the frequency of the RF channel to which the RF amplifier is normally tuned. If the harmonic frequency used for calibration is well outside the RF channel, de-tuning may still be beneficial but could be optional (as indicated by the dashed lines in FIG. 2), depending on the level of isolation required for accurate calibration.

Referring again to FIG. 2, in operation 60, complex mixer 24 down converts the IF calibration signal to baseband using the frequency conversion signal from lower accuracy oscillator 26, thereby introducing significant frequency error into the calibration signal at the demodulation frequency (in this example, the baseband frequency). According to the scheme shown in FIG. 1, during calibration, the frequencies of the harmonic supplied by harmonic filter 36 and the frequency conversion signal generated by frequency synthesizer 34 are selected such that the difference signal produced by first mixer 18 falls in the center of the IF passband to within the accuracy that can be achieved with high accuracy oscillator 32. Given that high accuracy reference oscillator 32 is substantially more accurate than lower accuracy oscillator 26, it can be assumed for purposes of calibration that the down-converted IF calibration signal is indeed at the center of the IF passband. Consequently, any frequency error observed at the demodulator can be attributed to lower accuracy oscillator 26. That is, the frequency conversion signal supplied by lower accuracy oscillator 26 to second mixer 24 is offset by some frequency error relative to a nominal frequency that oscillator 26 is supposed to produce to keep received signals in the center of the receiver channel.

If all of the oscillators used for frequency conversion in a receiver were perfectly accurate, the frequency of the down-converted signal arriving at the demodulator (e.g., the I and Q signals in a baseband I-Q type demodulator) would be precisely equal to a predetermined demodulation frequency, and a sequence of samples of the down-converted signal would have a fixed phase relative to a reference signal at the predetermined demodulation frequency (i.e., there would be no phase rotation of the down-converted signal over time relative to a reference baseband frequency signal). Any frequency error in the down-converted signal would result in a phase rotation relative to the reference signal, with the rate of the phase rotation indicating the magnitude of the frequency error and the direction of phase rotation indicating whether the frequency of the down-converted signal is higher or lower than the predetermined demodulation frequency.

In the configuration shown in FIG. 1, the I and Q signals are demodulated at baseband during normal receive operation. During calibration, these I and Q signals represent the unmodulated local calibration signal down-converted to baseband and can be used to compute an instantaneous phase of the calibration signal in the aforementioned manner. Referring again to FIG. 2, in operation 62, the I and Q signals are supplied to a frequency error processor 40 (FIG. 1) which computes the frequency error at the demodulation frequency (in this example, at baseband). Specifically, the frequency error is determined using the relationship that phase is the arctangent of (Q/I). This version of the arctangent function (sometimes called, ATAN2) can be defined from −180 degrees to +180 degrees. If the phase rotates with time (i.e., with successive instantaneous samples of I and Q), then the average rate of rotation (change in phase/time) can be used to compute the magnitude of the frequency error introduced by the lower accuracy oscillator. The direction of the phase rotation indicates whether the frequency of the frequency conversion signal generated by the lower accuracy oscillator frequency is higher or lower than its nominal value.

Preferably, the I and Q signals are sampled at a rate that yields a number of samples per cycle, such that the rate of phase rotation is easily discernable. Given that phase rotation angles are defined between ±180°, if the phase rotates more than approximately 120° between successive sample, there is low confidence that the measurements are reliable. In this case, it is assumed the measurements are noisy or excessive interference is present, the results of the calibration are ignored, and another calibration attempt is made at a later time.

The foregoing technique for measuring frequency error advantageously permits measurement of both whole and partial cycles of frequency error (i.e., the frequency error is measured with a granularity and accuracy of less than a single cycle at the demodulation frequency). By contrast, if a simple frequency counter is used to measure frequency error, the frequency counter would count zero in response to a 1 cycle error if its time base were less than one second in which to perform the frequency measurement. In the case of the invention, if samples of the I and Q signals are taken every 10 ms, then a 1 cycle error manifests itself as a 0.01 cycle rotation. By dividing the 0.01 cycle error by the 0.01 second time base, an error of 1 Hz is measured, with the direction of rotation providing the sign of the frequency error. Thus, the frequency error measurement technique employed in the I-Q signal embodiment of the invention permits measurements to be made very quickly using a small time base without sacrificing measurement accuracy. To accurately measure very small fractions of cycle error, a high signal-to-noise ratio is required, which is possible with the aforementioned techniques for isolating the receiver from the antenna and external signal (e.g., disconnecting the antenna and de-tuning the RF amplifier).

If the frequency error (magnitude and direction) is successfully determined from the down-converted calibration signal, the computed frequency error is supplied from frequency error processor 40 to frequency synthesizer 34, which adjusts the first frequency conversion signal supplied to first mixer 18 during normal receive operation to compensate for the frequency error (operation 64 in FIG. 2). In other words, frequency synthesizer 34 is re-tuned during subsequent normal receive operation to slightly adjust the frequency of the high-accuracy reference signal from high accuracy oscillator 32 in a manner that offsets or corrects for the frequency error introduced downstream by lower accuracy oscillator 26.

Note that by offsetting the frequency of the first frequency conversion signal (RF to IF) to compensate for frequency errors in the lower-accuracy second frequency conversion signal (IF to baseband in this example), incoming signals down converted to IF during normal receive operation are not quite centered in the IF passband (the IF is not required to be re-tuned in the calibration process). Consequently, the IF passband should be designed to be broad enough to accommodate the signal bandwidth plus any frequency shifts required to compensate for the maximum expected lower-accuracy oscillator errors. As previously noted, widening of the receiver bandwidth beyond the bandwidth of the signals to be received in order to account for frequency errors increases noise and interference. Advantageously, however, since the described system compensates for frequency errors such that no significant frequency error is present at the demodulation frequency (in this example, at baseband), the bandwidth at the demodulation frequency can be substantially equal to the bandwidth of the signal, such that no signal-to-noise ratio penalty is incurred in the system.

Figure 3:
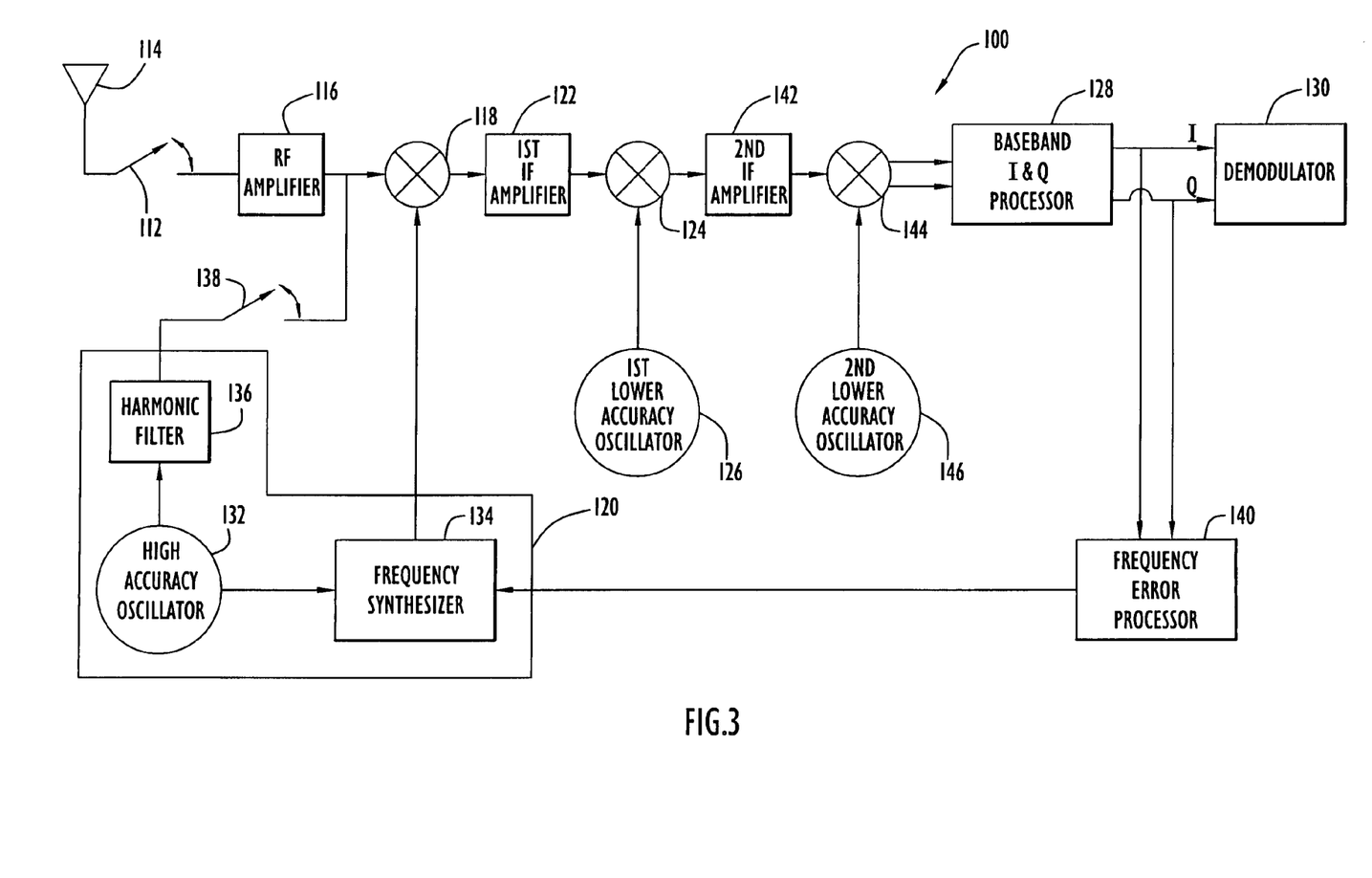
FIG. 3 is a functional block diagram of an RF receiver in which calibration is performed to compensate for frequency errors caused by plural lower accuracy oscillators used in plural IF stages.

In the exemplary embodiment shown in FIG. 1, a single lower accuracy oscillator is used in a single IF stage to down-convert signals from IF to baseband. However, the invention is not limited to receivers having a single IF stage or a single low-accuracy frequency conversion oscillator. More generally, the invention can be used to perform frequency calibration in receivers having multiple frequency conversion stages and multiple lower accuracy oscillators. An example of the invention in the context of a receiver including two IF down-conversion stages, each employing a lower accuracy oscillator, is illustrated in FIG. 3. Receiver 100 includes a switch 112, an antenna 114, an RF amplifier 116, a first frequency converter 118, a reference signal generator 120, a high accuracy reference oscillator 132, a frequency synthesizer 134, a harmonic filter 136, a switch 138, baseband I & Q processor 128, a demodulator 130, and a frequency error processor 140, all of which operate in a manner substantially similar to the corresponding elements shown in FIG. 1, although possibly at different frequencies.

Unlike the receiver shown in FIG. 1, which includes a single IF stage, receiver 100 shown in FIG. 3 includes: a first IF stage comprising a first IF amplifier 122, a first lower accuracy oscillator 126, and a second frequency converter 124 (i.e., a first IF down-conversion mixer); and a second IF stage comprising a second IF amplifier 142, a second lower accuracy oscillator 146, and a third frequency converter 144 (i.e., a second IF down-conversion mixer). After amplification by first IF amplifier 122, the resulting IF signal is supplied to the first IF mixer 124 which down-converts the IF signal to a lower IF frequency using a frequency conversion signal supplied by first lower accuracy oscillator 126. The resulting IF signal is then again amplified by second IF amplifier 142 and frequency converted to baseband by second IF mixer 144 using a frequency conversion signal from second lower accuracy oscillator 146. In this example, mixer 144 performs complex mixing to generate inphase (I) and quadrature (Q) signals which are processed by baseband I & Q processor 128 to produce I and Q baseband output signals. By way of non-limiting example, mixer 118 could down-convert an RF signal to 12.5 MHz, the first IF mixer 124 could down-convert the 12.5 MHz signal to 455 kHz, and the second IF mixer 144 could down-convert the 455 kHz signal to baseband. Note that it is not necessarily the case that every down-conversion stage will require another lower accuracy oscillator, since combinations of down-conversion frequencies may exist where one or more of the lower conversion frequencies can be derived from the high accuracy reference oscillator used to generate the RF-to-IF frequency conversion signal.

When there are multiple frequency conversions in the receiver after the initial RF down conversion, as in the configuration shown in FIG. 3, the measured frequency error is the composite frequency error from the lower accuracy oscillators. For example, both the first and second lower accuracy oscillators 126 and 146 shown in FIG. 3 introduce frequency errors. The frequency errors cause by both of these oscillators can be eliminated by measuring the rate and direction of phase rotation of the calibration signal at baseband (i.e., the I and Q signals) and then adjusting frequency synthesizer 134 to compensate for the error. The frequency error measured by frequency error processor 140 reflects the composite frequency error caused by the two lower accuracy oscillators in combination without regard to the particular frequency errors contributed by the individual oscillators. Likewise, the adjustment made to frequency synthesizer to produce a down-conversion mixing frequency that compensates for the measured composite frequency error does not take into account the frequency errors introduced by the individual lower accuracy oscillators but rather compensates for the composite frequency error from these oscillators as a whole. Thus, by adjusting a single frequency used for down-converting from RF, the errors introduced by multiple oscillators can be eliminated. Note that it is not important to eliminate frequency errors at each of the intermediate stages but rather to ensure that the composite frequency error is eliminated at the demodulation frequency. In this manner, the receiver bandwidth at the demodulation frequency can be set approximately to the bandwidth of the received signals so that no noise or interference penalty is incurred when receiving signals. At the intermediate frequency conversion stages, the only consideration regarding frequency errors is whether the signal remains within the receiver passband; thus, the IF passbands must be wide enough to account for the signal bandwidth and the maximum possible composite frequency error.

In the foregoing examples, the demodulation frequency at which the frequency error is determined is a baseband frequency, and the frequency error is computed using the I and Q samples of the baseband calibration signal. However, the invention is not limited to receivers employing baseband demodulation or the use of I and Q samples to determine the frequency error. More generally, the techniques of the invention can be applied at any demodulation frequency, and a variety of schemes can be employed to determine the frequency error.

Figure 4:
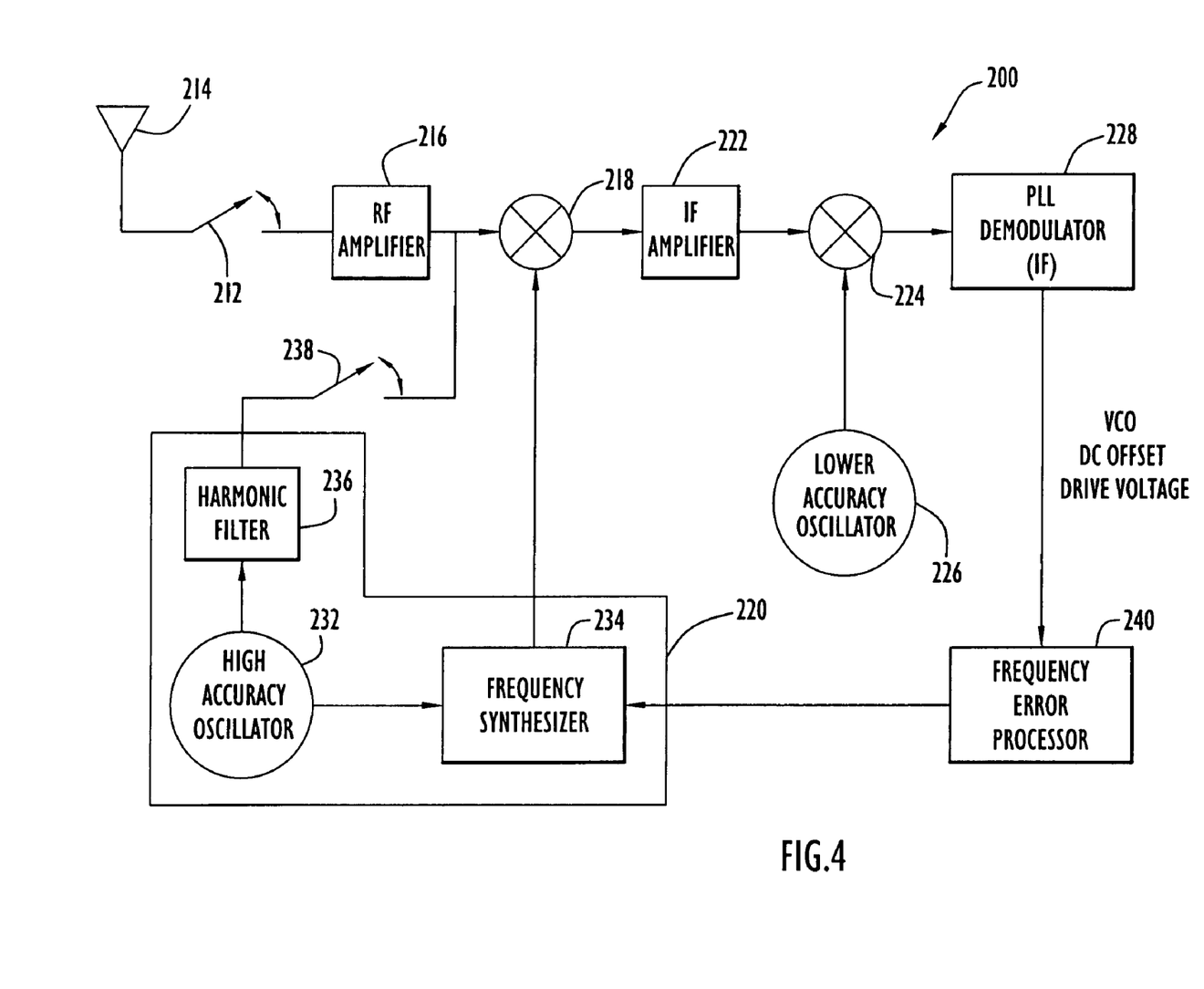
FIG. 4 is a functional block diagram of an RF receiver having a phase lock loop (PLL) type demodulator in which a voltage-controlled oscillator (VCO) control signal is used to measure frequency error in the oscillator calibration process.

FIG. 4 illustrates another embodiment of the invention in which a receiver 200 demodulates signals at an IF frequency using a phase lock loop (PLL) demodulator. Receiver 200 includes a switch 212, an antenna 214, an RF amplifier 216, a first frequency converter 218 (e.g., a first mixer), a reference signal generator 220, a high accuracy reference oscillator 232, a frequency synthesizer 234, a harmonic filter 236, a switch 238, an IF amplifier 222, a second frequency converter 224 (e.g., a second mixer), and a lower accuracy oscillator 226, all of which operate in a manner substantially similar to the corresponding elements shown in FIG. 1, although possibly at different frequencies. PLL demodulator 228 generates DC offset drive voltage for controlling the frequency of a voltage controlled oscillator (VCO) with the PLL. When the calibration signal is supplied to the PLL demodulator during calibration, this VCO drive voltage reflects the frequency error introduced by lower accuracy oscillator 226. Accordingly, the VCO drive voltage can be supplied to frequency error processor 240, which responds by producing a corresponding signal to adjust the frequency of the RF frequency conversion signal supplied to first mixer 218 to compensate for the frequency error during subsequent normal receive operation.

The techniques of the invention are particularly useful in receiver devices in which at least one low-cost and relatively inaccuracy oscillator is used; however, the invention is applicable in virtually any receiver having two or more oscillators, wherein at least one oscillator is less accurate than another oscillator. Examples of low-cost, higher performance radio systems in which the invention would be useful include: SINCGARS, BOWMAN, SLICE, JTRS, and handheld radios. More generally, the invention can be employed in receivers in virtually any communication device or radio that receives transmitted signals and performs frequency conversion in the course of processing such received signals including, but not limited to: mobile and stationary communication devices; terrestrial, airborne, and space-based communication devices; navigational devices such as GPS equipment; communication devices including two-way radios, wireless telephony, and multimedia devices capable of receiving audio, video and/or data information; and devices that receive signals but do not necessarily transmit signals. Further, while particular frequencies are mentioned herein in the context of an exemplary embodiment, it will be understood that the invention is not limited to any particular frequencies.

Having described preferred embodiments of new and improved methods and apparatus for calibrating oscillators in a receiver, it is believed that other modifications, variations and changes will be suggested to those skilled in the art in view of the teachings set forth herein. It is therefore to be understood that all such variations, modifications and changes are believed to fall within the scope of the present invention as defined by the appended claims and their equiva-

What is claimed is:

1. A receiver, comprising:
a reference signal generator comprising a first oscillator supplying a reference frequency signal, the reference signal generator producing both a first frequency conversion signal and a local calibration signal from the reference frequency signal, wherein the local calibration signal is generated from a harmonic of the reference frequency signal;
a first frequency converter responsive to the first frequency conversion signal to down-convert a frequency of a received signal during normal receive operation and to down-convert a frequency of the local calibration signal from the reference signal generator using the first frequency conversion signal from the reference signal generator during calibration processing;
a first switch in a path between an antenna and the receiver;
a second switch in a path between the reference signal generator and the first frequency converter, wherein the first switch is closed and the second switch is open during normal receive operation such that the received signal is supplied to the first frequency converter, and the first switch is open and the second switch is closed during calibration processing such that the local calibration signal is supplied to the first frequency converter;
a second oscillator having a lower accuracy than the first oscillator, the second oscillator generating a second frequency conversion signal;
a second frequency converter responsive to the second frequency conversion signal to further down-convert the frequency of the received signal during normal receive operation and to further down-convert the frequency of the local calibration signal during calibration processing;
a demodulator configured to demodulate the received signal at a demodulation frequency during normal receive operation; and
a frequency error processor configured to determine a frequency error from the local calibration signal at the demodulation frequency during calibration processing, wherein the reference signal generator adjusts a frequency of the first frequency conversion signal used during normal receive operation in response to the frequency error to compensate for the frequency error, wherein adjusting the frequency of the first frequency conversion signal compensates for frequency errors introduced by the second oscillator.

2. The receiver of claim 1, wherein, during calibration processing, the reference signal generator adjusts the first frequency conversion signal such that the frequency of the down-convened local calibration signal is centered in an intermediate frequency (IF) passband.

3. The receiver of claim 1, wherein the reference signal generator further comprises a frequency synthesizer that generates the first frequency conversion signal used during normal receive operation in response to the reference frequency signal and a signal from the frequency error processor indicative of the frequency error.

4. The receiver of claim 1, further comprising a harmonic filter configured to receive the reference frequency signal and harmonics thereof and to generate the local calibration signal from a harmonic of the reference frequency signal.

5. The receiver of claim 1, wherein the receiver is isolated from external signals during calibration processing.

6. The receiver of claim 5, wherein the receiver is isolated from external signals by disconnecting an antenna from the receiver during calibration processing.

7. The receiver of claim 5, further comprising an RF amplifier that supplies the received signal to the first frequency converter during normal receive operation, wherein the receiver is isolated from external signals during calibration processing by de-tuning the RF amplifier to a frequency different from the frequency of the local calibration signal.

8. The receiver of claim 1, wherein the demodulation frequency is a baseband frequency.

9. The receiver of claim 1, the frequency error processor determines the frequency error from inphase (I) and quadrature (Q) samples of the local calibration signal.

10. The receiver of claim 9, wherein the magnitude of the frequency error is determined from a rate of phase rotation computed from the arctangent of (Q/I), and a sign of the frequency error is determined from a direction of phase rotation.

11. The receiver of claim 1, wherein frequency error processor measures the frequency error to an accuracy of a partial cycle at the demodulation frequency.

12. The receiver of claim 1, wherein the demodulation frequency is an intermediate frequency.

13. The receiver of claim 1, wherein the demodulator is a phase lock loop (PLL) type demodulator, and the frequency error processor determines the frequency error from a control signal generated by the PLL type demodulator.

14. The receiver of claim 1, further comprising:
a third oscillator having a lower accuracy than the first oscillator, the third oscillator generating a third frequency conversion signal; and
a third frequency converter responsive to the third frequency conversion signal to further down-convert the frequency of the received signal during normal receive operation and to further down-convert the frequency of the local calibration signal during calibration processing,
wherein the frequency error determined by the frequency error processor is a composite frequency error resulting from frequency errors caused by the second and third oscillators, and wherein the reference signal generator adjusts the frequency of the first frequency conversion signal used during normal receive operation to compensate for the composite frequency error.

15. The receiver of claim 1, wherein the second oscillator is un-calibrated.

16. In a receiver employing a reference oscillator and a lower accuracy oscillator, a method for calibrating oscillator frequency to compensate for a frequency error caused by the lower accuracy oscillator, comprising:
(a) isolating the receiver from external signals by opening a first switch between an antenna and the receiver during calibration processing;
(b) generating a local calibration signal from a harmonic of a reference frequency signal supplied by the reference oscillator and supplying the local calibration signal to the receiver via a path including a second switch that is closed during calibration processing;
(c) down-converting the frequency of the local calibration signal generated from the reference frequency signal using a first frequency conversion signal also generated from the reference frequency signal;
(d) further down-converting the frequency of the local calibration signal in accordance with a second frequency conversion signal generated by the lower accuracy oscillator;

(e) measuring the frequency error from the local calibration signal at a demodulation frequency; and (f) adjusting a frequency of the first frequency conversion signal used for subsequent reception of external signals to compensate for the frequency error caused by the lower accuracy oscillator.

17. The method of claim 16, wherein (c) includes down-converting the frequency of the local calibration signal using a first frequency conversion signal having a frequency such that the frequency of the down-converted local calibration signal is centered in an intermediate frequency (IF) passband.

18. The method of claim 1, wherein (a) includes disconnecting an antenna from the receiver.

19. The method of claim 16, wherein (a) includes de-tuning an RF amplifier of the receiver to a frequency different from the frequency of the local calibration signal.

20. The method of claim 16, wherein the demodulation frequency is a baseband frequency.

21. The method of claim 16, wherein (e) includes determining the frequency error from inphase (I) and quadrature (Q) samples of the local calibration signal.

22. The method of claim 21, wherein (e) includes determining the magnitude of the frequency error from a rate of phase rotation computed from the arctangent of (Q/I), and determining a sign of the frequency error from a direction of phase rotation.

23. The method of claim 16, wherein (e) includes determining the frequency error to an accuracy of a partial cycle at the demodulation frequency.

24. The method of claim 16, wherein the demodulation frequency is an intermediate frequency.

25. The method of claim 16, wherein (e) includes determining the frequency error from a control signal generated by a phase lock loop (PLL) type demodulator.

26. The method of claim 16, further comprising:

(g) further down-converting the frequency of the local calibration signal in accordance with a third frequency conversion signal generated by a second lower accuracy oscillator;

wherein (e) includes determining the frequency error that is a composite frequency error resulting from frequency errors caused by the lower accuracy oscillator and the second lower accuracy oscillator, and wherein (f) includes adjusting the frequency of the first frequency conversion signal to compensate for the composite frequency error.

27. The method of claim 16, wherein the second oscillator remains un-calibrated.

* * * * *

UNITED STATES PATENT AND TRADEMARK OFFICE
CERTIFICATE OF CORRECTION

| | | |
|---|---|---|
| PATENT NO. | : 7,720,451 B2 | Page 1 of 1 |
| APPLICATION NO. | : 11/002151 | |
| DATED | : May 18, 2010 | |
| INVENTOR(S) | : Rodgers et al. | |

It is certified that error appears in the above-identified patent and that said Letters Patent is hereby corrected as shown below:

Column 11, line 54, replace "down-convened local calibration" with -- down-converted local calibration --.

Signed and Sealed this

Twenty-seventh Day of July, 2010

David J. Kappos
*Director of the United States Patent and Trademark Office*